United States Patent
Moriya et al.

(10) Patent No.: US 8,058,186 B2
(45) Date of Patent: Nov. 15, 2011

(54) COMPONENTS FOR SUBSTRATE PROCESSING APPARATUS AND MANUFACTURING METHOD THEREOF

(75) Inventors: Tsuyoshi Moriya, Nirasaki (JP); Kouji Mitsuhashi, Nirasaki (JP); Akira Uedono, Tsukuba (JP)

(73) Assignee: Tokyo Electron Limited, Tokyo (JP)

( * ) Notice: Subject to any disclaimer, the term of this patent is extended or adjusted under 35 U.S.C. 154(b) by 733 days.

(21) Appl. No.: 11/270,671

(22) Filed: Nov. 10, 2005

(65) Prior Publication Data
US 2006/0096703 A1 May 11, 2006

Related U.S. Application Data

(60) Provisional application No. 60/635,968, filed on Dec. 15, 2004.

(30) Foreign Application Priority Data

Nov. 10, 2004 (JP) .................................. 2004-327077

(51) Int. Cl.
*H01L 21/26* (2006.01)

(52) U.S. Cl. .................... 438/795; 438/410; 156/345.19; 118/105

(58) Field of Classification Search .................. 438/710, 438/795; 156/345.19; 118/105
See application file for complete search history.

(56) References Cited

U.S. PATENT DOCUMENTS

| | | | |
|---|---|---|---|
| 6,508,911 B1 * | 1/2003 | Han et al. | 156/345.1 |
| 6,815,352 B1 * | 11/2004 | Tamura et al. | 438/691 |
| 6,890,861 B1 * | 5/2005 | Bosch | 438/706 |
| 2002/0084558 A1 * | 7/2002 | Hanzawa et al. | 266/236 |
| 2002/0168867 A1 * | 11/2002 | Haerle et al. | 438/758 |
| 2003/0198742 A1 * | 10/2003 | Vrtis et al. | 427/255.28 |
| 2003/0198749 A1 | 10/2003 | Kumar et al. | |
| 2004/0092120 A1 * | 5/2004 | Wicker | 438/710 |

FOREIGN PATENT DOCUMENTS

| | | |
|---|---|---|
| JP | 2004-193354 | 7/2004 |
| KR | 10-0203129 | 3/1999 |
| KR | 0170907 | 3/1999 |

OTHER PUBLICATIONS

Office Action issued May 17, 2011, in Chinese Application No. 200710165026.1, with English Translation.

* cited by examiner

*Primary Examiner* — Alexander Ghyka

(74) *Attorney, Agent, or Firm* — Oblon, Spivak, McClelland, Maier & Neustadt, L.L.P.

(57) ABSTRACT

A focus ring is shaped by cutting off a silicon carbide body formed by a sintering method or a CVD method. The shaped focus ring is exposed to a plasma generated from at least one of a carbon tetra fluoride gas and an oxygen gas for producing impurities, and the impurities are introduced to void-like defects existing in the vicinity of a surface of the focus ring. Subsequently, positrons are injected in the vicinity of the surface of the focus ring into which the impurities are introduced, and the defect density in the vicinity of the surface of the focus ring is detected by the positron annihilation method.

4 Claims, 8 Drawing Sheets

COMPONENTS FOR SUBSTRATE PROCESSING APPARATUS AND MANUFACTURING METHOD THEREOF

CROSS-REFERENCE TO RELATED APPLICATIONS

This document claims priority to Japanese Patent Application Number 2004-327077, filed Nov. 10, 2004 and U.S. Provisional Application No. 60/635,968, filed Dec. 15, 2004, the entire content of which are hereby incorporated by reference.

FIELD OF THE INVENTION

The present invention relates to parts for a substrate processing apparatus and a method for the manufacture thereof; and more particularly, to parts for a substrate processing apparatus, which are used in a wear environment, and a manufacturing method thereof.

BACKGROUND OF THE INVENTION

In general, a substrate processing apparatus for performing an etching process on a substrate, e.g., a semiconductor wafer (hereinafter, referred to as a 'wafer'), has an accommodation vessel (hereinafter, referred to as a 'chamber') for accommodating the wafer therein. In such a substrate processing apparatus, a high frequency power is applied into the chamber to produce a plasma from a processing gas such as a $CF_4$ based gas or the like, and an etching process is carried out on a surface of the wafer by using a produced plasma.

In the chamber, there are disposed various parts for maintaining the plasma at a predetermined state; and a focus ring has been known as one of these. The focus ring is a ring-shaped part and is disposed to surround a periphery of a circular plate-shaped wafer in the chamber. The focus ring needs to have a similar electric characteristic, e.g., conductivity, to that of the wafer to guide the plasma in the chamber to the wafer efficiently. Thus, a conventional focus ring has been formed by silicon (Si).

Since, however, the silicon is eroded by the plasma, the focus ring is consumed and deformed in the chamber in a short period. If the focus ring is deformed, the plasma state on the wafer is changed. Thus, the focus ring needs to be replaced in a short period in case where a silicon focus ring is employed.

Therefore, a focus ring made of silicon carbide (SiC), which is known as a material that is hardly eroded by the plasma, has been used recently. Silicon carbide has substantially the same conductivity as the wafer; and it does not incur metal contamination under a plasma atmosphere. Therefore, it is advantageously employed as a part in the chamber.

As for the silicon carbide, there have been known a sintered silicon carbide formed by a sintering method and a CVD silicon carbide formed by a CVD method. The amounts of wear of the former and the latter due to the plasma are about 15% less and about 50% less, respectively, compared to that of silicon.

Since, however, the sintered silicon carbide is known to be likely to produce particles, it has been proposed that a surface of the focus ring formed by the sintered silicon carbide is coated with the CVD silicon carbide that is unlikely to produce particles (see, e.g., Japanese Patent Laid-open Application No. 10-135093). Hence, it is possible to suppress particle generation from the focus ring.

However, the CVD silicon carbide is obtained by introducing a material gas around a graphite base material disposed in a high temperature atmosphere, to form a silicon carbide thick film on a surface thereof; and cutting off a formed thick film. Further, since a surface of the CVD silicon carbide thus obtained is rough, lapping is carried out on the focus ring to improve the appearance and to prevent particle scattering by smoothing the surface thereof. Hence, the manufacture of the focus ring by using the CVD silicon carbide is rather difficult.

Further, even though the CVD silicon carbide is unlikely to produce particles, some particles are still produced. In particular, many particles are generated during an initial etching process after a loading a new focus ring, specifically, for initial 120 hours of a high frequency power application. Accordingly, in case where the CVD silicon carbide focus ring is employed, a seasoning process needs to be performed for a long period to stabilize an atmosphere in the chamber after the exchange of the focus ring; hence a decrease in an operating rate of the substrate processing apparatus becomes problematic.

SUMMARY OF THE INVENTION

It is, therefore, an object of the present invention to provide parts for a substrate processing apparatus and a manufacturing method thereof, capable of suppressing particle generation, preventing a decrease in an operating rate of the substrate processing apparatus, and being manufactured easily.

In accordance with one aspect of the present invention, there is provided a method for manufacturing a part for a substrate processing apparatus, which is installed in a chamber of the substrate processing apparatus for accommodating therein a substrate, the method including the step of lowering a void defect density in the vicinity of a surface of the part for the substrate processing apparatus.

Here, in the defect density lowering step, impurities may be introduced to the defects.

Further, the impurities may be produced from a plasma generated from at least one of a fluorine containing gas, a carbon containing gas and an oxygen containing gas.

Still further, in the defect density lowering step, a heat treatment may be performed on the part for the substrate processing apparatus.

Still further, in the defect density lowering step, the temperature of the part for the substrate processing apparatus may be set in the range of 1200° C.~1600° C. in a nonreactive gas atmosphere.

Still further, the method for manufacturing the part for the substrate processing apparatus may further include the step of examining the vicinity of a surface of the part for the substrate processing apparatus by a positron annihilation method.

In accordance with another aspect of the present invention, there is provided a part for a substrate processing apparatus, which is installed in a chamber of the substrate processing apparatus for accommodating therein a substrate, wherein a void defect density in the vicinity of a surface thereof is smaller than that in the vicinity of a surface of a silicon carbide body formed by a chemical vapor deposition method.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, preferred embodiments of the present invention will be described in detail with reference to the accompanying drawings.

First, a part for a substrate processing apparatus and a manufacturing method thereof in accordance with a first embodiment of the present invention will now be explained.

Figure 1:
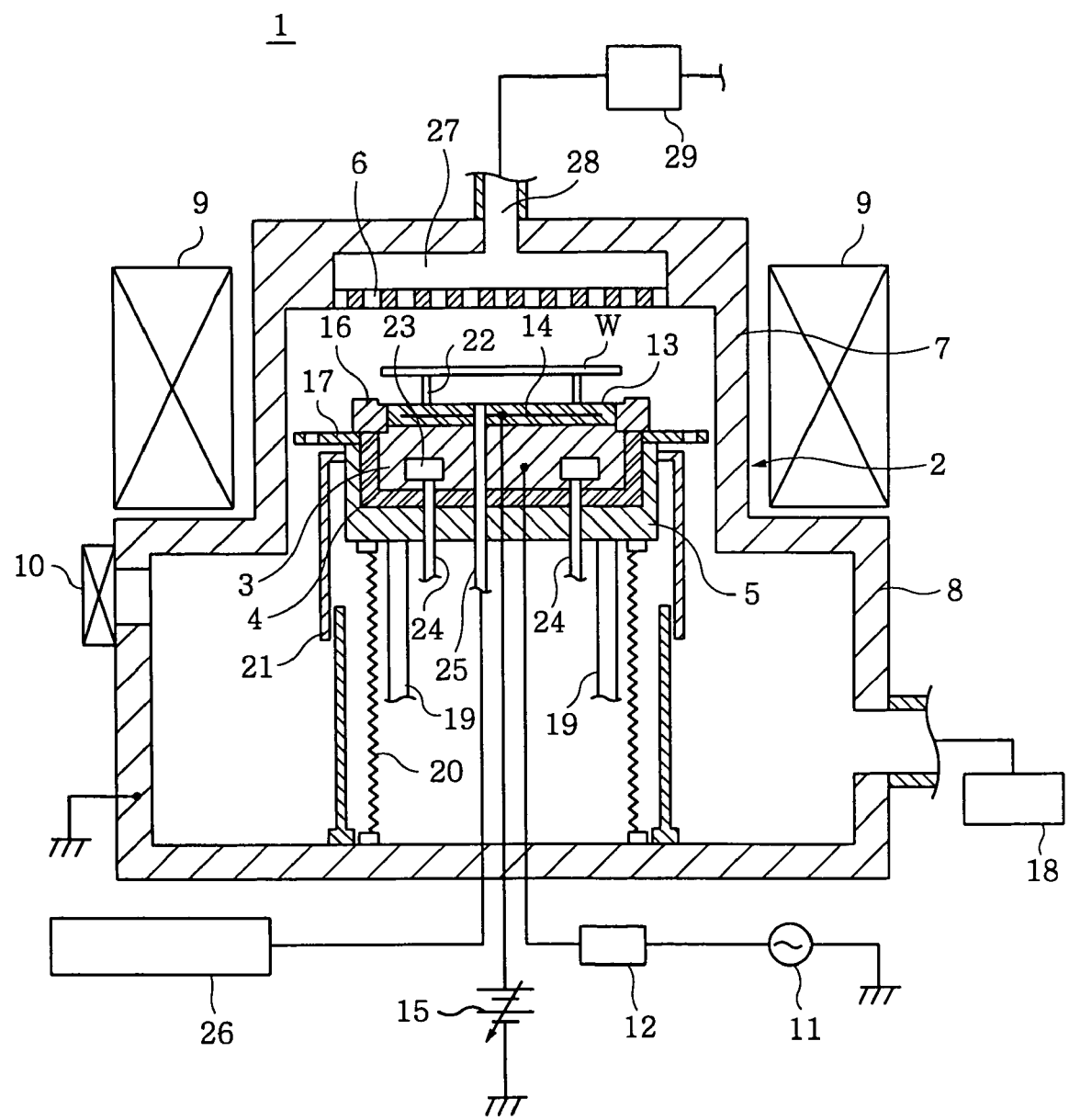
FIG. 1 is a cross sectional view showing a schematic configuration of a substrate processing apparatus using a focus ring employed as a parts in accordance with a first embodiment of the present invention.

FIG. 1 is a cross sectional view showing a schematic configuration of a substrate processing apparatus using a focus ring as a part for the apparatus in accordance with a first embodiment of the present invention.

In FIG. 1, an etching processing apparatus 1 employed as a substrate processing apparatus includes a cylindrical chamber 2 made of, e.g., aluminum; a lower electrode 3, disposed in the chamber 2, for mounting thereon a semiconductor wafer W of, e.g., a 200 mm diameter; an elevatable supporter 5 for supporting the lower electrode 3 through an insulating member 4; and a shower head 6 as an upper electrode, disposed at an upper part of the chamber 2 to face the lower electrode 3.

The chamber 2 has an upper chamber 7 of a smaller diameter, and a lower chamber 9 of a larger diameter. Around the upper chamber 7, there is disposed a dipole ring magnet 9 to form a uniform horizontal magnetic field, which heads for one direction inside the upper chamber 7. A gate valve 10 for opening and closing a loading/unloading port of the semiconductor wafer W is installed at an upper side portion of the lower chamber 8, through which the etching processing apparatus 1 is coupled to a neighboring load-lock chamber (not shown) or the like.

A high frequency power supply 11, connected to the lower electrode 3 via a matching unit 12, applies a high frequency power to the lower electrode 3. Accordingly, the lower electrode 3 serves as a lower electrode.

On a top surface of the lower electrode 3, there is disposed an electrostatic chuck (ESC) 13 for adsorbing thereon the semiconductor wafer W by an electrostatic force. A circular plate-shaped electrode plate 14 made of a conductive film is embedded in the electrostatic chuck 13; and a DC power supply 15 is electrically connected to the electrode plate 14. The semiconductor wafer W is adsorbed on a top surface of the electrostatic chuck 13 to be supported thereon by a columbic force or the like, which is generated by a DC voltage applied to the electrode plate 14 from the DC power supply 15.

Around the electrostatic chuck 13, a circular ring shaped-focus ring 16 is disposed. Thus, the periphery of the semiconductor wafer W adsorbed on the electrostatic chuck 13 is surrounded by the focus ring 16. Further, the focus ring 16 is made of silicon carbide and thus has substantially the same conductivity as the semiconductor wafer W. Therefore, the focus ring 16 may efficiently guide a plasma, which is produced in the chamber 2 as will be described later, to the semiconductor wafer W. Here, the focus ring 16 is manufactured by a method for manufacturing parts for a substrate processing apparatus in accordance with the preferred embodiment of the present embodiment that will be explained later; and a ratio of void-like defects (hereinafter, referred to as a 'defect density') in the vicinity of a surface is set to be lower than that in the vicinity of a silicon carbide body formed by a CVD method.

Between a sidewall of the upper chamber 7 and the lower electrode 3, there is formed an exhaust passageway for discharging a gas from the upper side of the lower electrode 3 to the outside of the chamber 2, and a ring-shaped evacuation plate 17 is disposed in the middle of the exhaust passageway. A space below the evacuation plate 17 of the exhaust passageway (an inner space of the lower chamber 8) communicates with a gas pumping system 18 for controlling a pressure in the chamber 2 and also depressurizing an inside of the chamber 2 to be in a near-vacuum state.

Below the lower electrode 3, there is disposed a lower electrode elevation mechanism formed of a ball screw 19 provided to be downwardly extended from a lower portion of the supporter 5. The lower electrode elevation mechanism supports and elevates the lower electrode 3 to control a gap between the upper and the lower electrode through the supporter 5 by rotating the ball screw 19 using a motor or the like (not shown). The lower electrode elevation mechanism is isolated from an atmosphere in the chamber 2 by a bellows 20 disposed therearound, and a bellows cover 21 disposed around the bellows 20.

Further, at the lower electrode 3, a plurality of pusher pins 22 is disposed to be freely protruded from the top surface of the electrostatic chuck 13. These pusher pins 22 move in the upper and the lower direction in the drawing.

In this etching processing apparatus 1, the lower electrode 3 is lowered to a position where the semiconductor wafer W is loaded or unloaded, and the pusher pins 22 are protruded from the top surface of the electrostatic chuck 13 to lift up the semiconductor wafer W away from the lower electrode 3 to load or unload the semiconductor wafer W. Further, during the etching processing of the semiconductor wafer W, the lower electrode 3 is elevated to a processing position of the semiconductor wafer W, and the pusher pins 22 are retreated in the lower electrode 3, so that the semiconductor wafer W is adsorbed on the electrostatic chuck 13 to be supported thereon.

Further, e.g., a ring-shaped coolant chamber 23, extended in the circumferential direction, is provided in the lower electrode 3. Into the coolant chamber 23, a coolant, e.g., a cooling water, of a predetermined temperature is supplied and circulated from a chiller unit (not shown) through a piping 24; and a processing temperature of the semiconductor wafer W mounted on the lower electrode 3 is controlled by the coolant temperature.

On the top surface of the electrostatic chuck 13, there are formed a multiplicity of heat transfer gas supply holes and grooves (not shown). These heat transfer gas supply holes and the like are coupled to a heat transfer gas supply unit 26 through a heat transfer gas supply line 25 disposed in the lower electrode 3; and the heat transfer gas supply unit 26 supplies a heat transfer gas, e.g., an He gas, to a gap between the electrostatic chuck 13 and the semiconductor wafer W. This heat transfer gas supply unit 26 is also configured to vacuum-exhaust the gap between the electrostatic chuck 13 and the semiconductor wafer W.

The shower head 6 disposed at a ceiling portion of the chamber 2 is grounded (earthed) to serve as a ground electrode. Further, on a top surface of the shower head 6, there is provided a buffer space 27, to which a processing gas inlet line 28 is connected from a processing gas supply unit (not shown). An MFC (Mass Flow Controller) 29 is disposed in the middle of the processing gas inlet line 28. The MFC 29 supplies a predetermined gas, e.g., a processing gas or an $N_2$ gas, into the chamber 2 through the buffer space 27 and the shower head 6; and at the same time, works together with the gas pumping system 18 to control the pressure in the chamber 2 to a desired level by controlling a flow rate of a corresponding gas.

As mentioned above, in the etching processing apparatus 1, a high frequency power is applied to the lower electrode 3; and, by the applied high frequency power, a high-density plasma is generated and ions are produced from the processing gas between the lower electrode 3 and the shower head 6.

In the etching processing apparatus 1, the gate valve 10 is opened first during the etching process to load into the chamber 2 the semiconductor wafer W as an object to be processed. Further, a processing gas (e.g., a gaseous mixture of at least one of a carbon tetra fluoride ($CF_4$) gas and an oxygen ($O_2$) gas with a predetermined flow rate ratio) is introduced into the chamber 2 with a predetermined flow rate and a flow rate ratio; and an inner pressure of the chamber 2 is set at a predetermined level by the gas pumping system 18 or the like. Still further, a high frequency power from the high frequency power supply 11 is applied to the lower electrode 3, and a DC voltage from the DC power supply 15 is applied to the electrode plate 14, thereby adsorbing the semiconductor wafer W on the lower electrode 3. Then, the processing gas discharged from the shower head 6 is turned into a plasma, as described above. The plasma is collected on the surface of the semiconductor wafer W by the focus ring 16; and the surface of the semiconductor wafer W is physically etched by ions, e.g., fluorine ions or oxygen ions, produced by the plasma.

As described above, in case of the focus ring 16 formed by the silicon carbide, either one of a silicon carbide formed by a sintering method (hereinafter, referred to as a 'sintered silicon carbide') and a silicon carbide formed by a CVD method (hereinafter, referred to as a 'CVD silicon carbide') is employed as the silicon carbide. However, it has been conventionally known that the focus ring 16 produces particles during an initial etching process, in any case of employing the sintered silicon carbide or the CVD silicon carbide.

It is difficult to clearly explain a particle generation mechanism at the initial etching processing stage. Thus, in order to infer a hypothesis of the mechanism, the present inventors monitored the number of particles from the focus ring (particles silicon carbide) and a consumption amount of focus ring as a function of an etching processing time, by manufacturing a silicon carbide focus ring and arranging it in the chamber.

As a result, the present inventors found that, at the time after applying a high frequency power for 15 minutes, many particles are produced in the chamber 2 and one-third of the particles are originated from the focus ring, while the erosion of the focus ring is hardly observable. Further, the present inventors also found that, at the time after applying the high frequency power for 80 hours, the number of particles in the chamber 2 is decreased; ¹/₁₀ of the particles are originated from the focus ring; and the focus ring is being consumed.

Namely, the present inventors concluded that the number of particles produced from the focus ring is decreased accompanied by the consumption of the focus ring. Accordingly, the present inventors inferred the following hypothesis on the particle generation mechanism at the initial etching processing stage, as shown in FIG. 2.

Figure 2A:
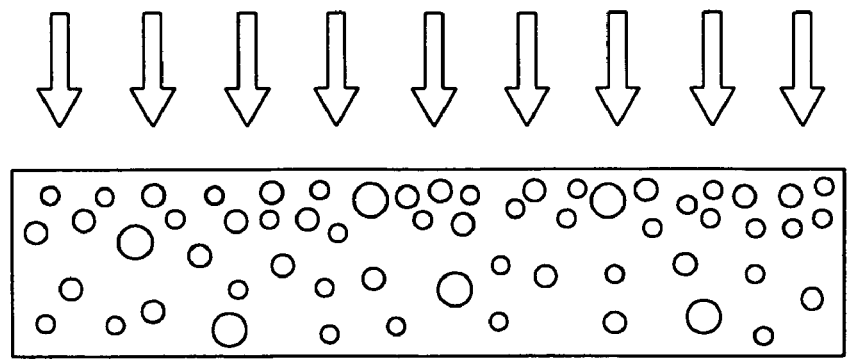
FIGS. 2A to 2C provide particle generation mechanisms at an initial etching processing stage.

In the vicinity of the surface of the silicon carbide focus ring, there exist a large number of void-like defects (indicated by circles in the drawing) resulting from the deficiency of carbon and/or silicon; and the density thereof is increased close to the surface. Therefore, a brittle layer is thought to be formed on the surface of the focus ring (FIG. 2A).

Figure 2B:
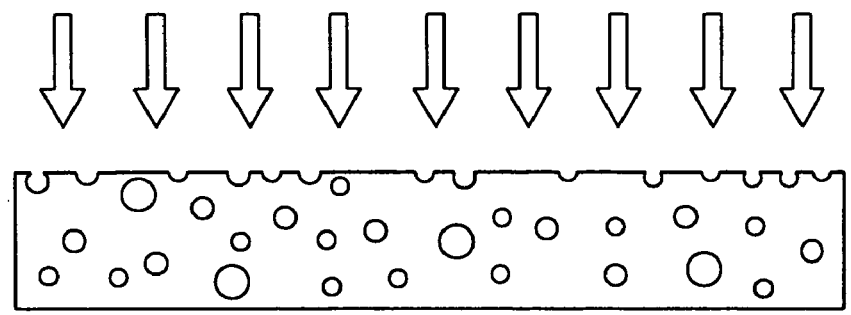

At the initial etching processing stage, if ions collide with this brittle layer as indicated by arrows in the drawing, kinetic energies thereof are transferred to the brittle layer, and silicon carbide molecules in the brittle layer are scattered as particles (FIG. 2B).

Figure 2C:
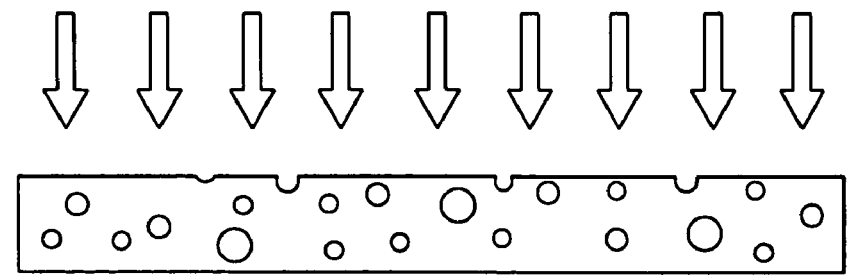

If the etching process is carried out on the semiconductor wafer W for a long time, the focus ring disposed to surround the periphery of the semiconductor wafer W is also exposed to the plasma for a long time to erode the brittle layer, and therefore, a relatively dense layer below the brittle layer is exposed. Even though ions and the like collide with the dense layer as indicated by arrows in the drawing, the silicon carbide molecules in the dense layer are not scattered since a molecular force of silicon carbide in the dense layer is large. As a result, particles are hardly generated (FIG. 2C).

Namely, the defect density and the amount of particle generation are closely related to each other; i.e., if the defect density is low, the amount of particle generation becomes less.

Based on this hypothesis, the defect density in the vicinity of the surface of the silicon carbide focus ring serving as the parts for the substrate processing apparatus is set to be decreased in the method for manufacturing the parts for the substrate processing apparatus in accordance with the first preferred embodiment of the present invention.

Figure 3:
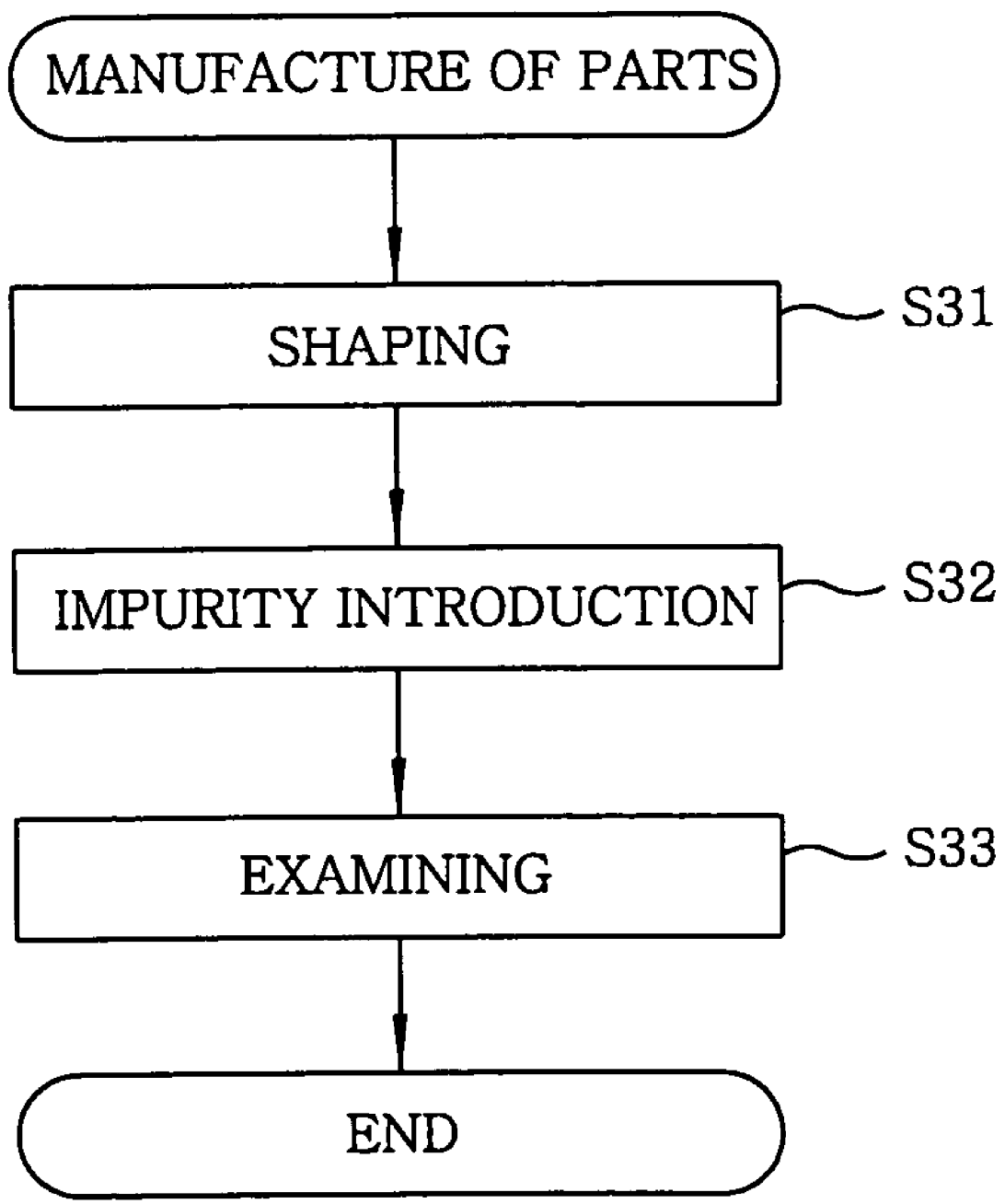
FIG. 3 is a flowchart of a part manufacturing process as a manufacturing method for a part for a substrate processing apparatus in accordance with the present embodiment.

Referring to FIG. 3, there is illustrated a flowchart of a part manufacturing process as the method for manufacturing the parts for the substrate processing apparatus in accordance with the first embodiment of the present invention.

In FIG. 3, a silicon carbide body of a desired size is formed first by the sintering method or the CVD method, and the silicon carbide body thus formed is shaped into a focus ring by machining (step S31).

Subsequently, the shaped focus ring is exposed to a plasma generated from at least one of a tetra fluoride carbon gas and an oxygen gas for producing impurities; and the impurities, e.g., fluorine ions or oxygen ions, from the plasma are introduced into the void-like defects in the vicinity of the surface of the focus ring (a defect density lowering step) (step S32).

Figure 4A:
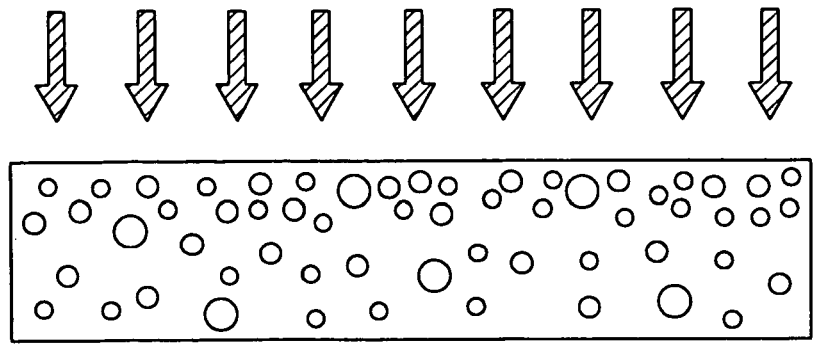
FIGS. 4A to 4C offer diagrams for showing impurity introduction processes in step S32 of FIG. 3.
Figure 4B:
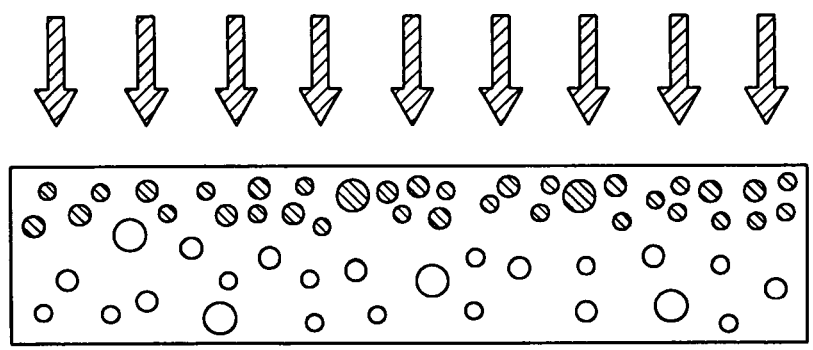
Figure 4C:
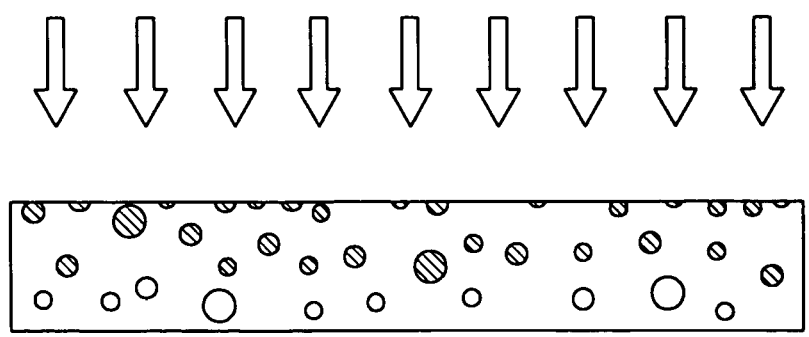

In step S32, the plasma is irradiated first towards the surface of the shaped focus ring as indicated by hatched arrows in FIG. 4, so that the fluorine ions or the oxygen ions in the plasma are introduced as impurities into the defects by a doping, e.g., an ion implantation process. The fluorine ions, the oxygen ions or the like, which are introduced to the defects, enhance an electrical bonding force (a molecular force) between the silicon carbide molecules in contact with the defects. Further, the fluorine ions, the oxygen ions or the like introduced to the defects remain therein (as indicated by hatched circles in the drawing). Therefore, the defect density is lowered in the vicinity of the surface of the focus ring, and the top surface layer of the focus ring becomes a relatively dense layer (hereinafter, referred to as an 'impurity introduced layer') (FIG. 4B).

Since, however, the fluorine ions, the oxygen ions or the like are introduced only to the defects in the vicinity of the surface of the focus ring, the impurity introduced layer is likely to be consumed rapidly if the focus ring having such a thin impurity introduced layer is disposed in the chamber to be etched.

However, the focus ring is also exposed to the plasma (as indicated by white arrows in FIG. 4) produced from the processing gas containing at least one of the carbon tetra fluoride gas and the oxygen gas during the etching processing. Thus, even while the impurity introduced layer is consumed, the impurities, e.g., the fluorine ions or the oxygen ions, in the plasma are continuously introduced to defects in the vicinity of a surface newly exposed to the plasma due to the consumption of the impurity introduced layer. Namely, a defect density in the vicinity of the new exposed surface is continuously decreased, and a new impurity introduced layer is formed.

Therefore, it is preferable that the plasma employed for the impurity introduction in step S32 is the same type used in the etching process.

Figure 5:
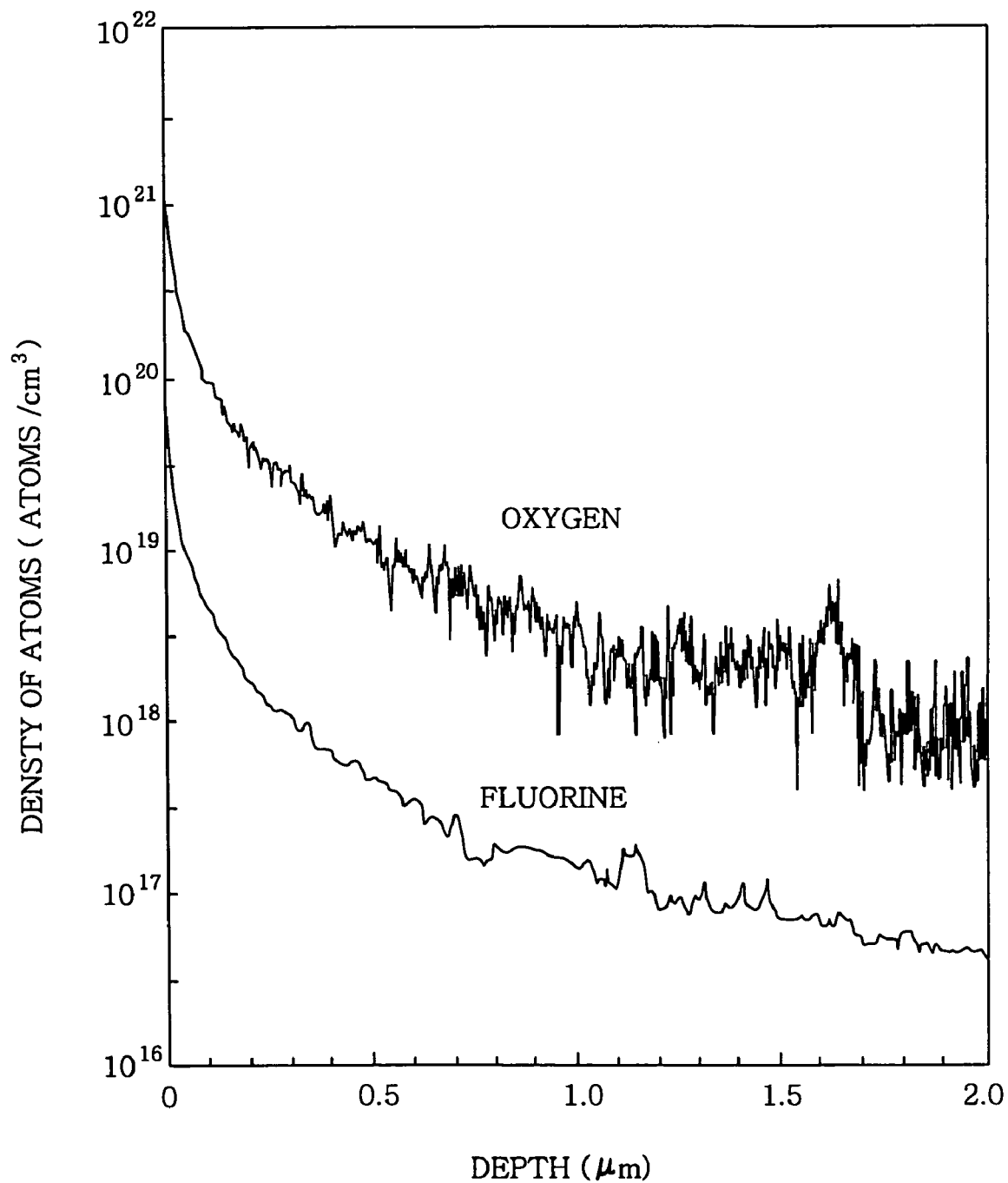
FIG. 5 is a graph for providing a result on an impurity introduction in step S32 of FIG. 3.

FIG. 5 is a graph for showing a result of the impurity introduction carried out in step S32 of FIG. 3.

In FIG. 5, the vertical axis is a density of each atom, and the horizontal axis is a depth from the surface of the focus ring. The graph provides a SIMS (Secondary Ion Mass Spectrometry) analysis result on the focus ring made of the sintered silicon carbide, to which impurities are introduced.

As illustrated in the drawing, the focus ring exposed to the plasma has fluorine and oxygen atoms within the range from the surface to about 2 μm in depth thereof. Accordingly, the fluorine ions and the oxygen ions in the plasma are introduced to the defects within the range from the surface to 2 μm in depth by the impurity introduction. Hence, the focus ring on which the impurity introduction is carried out has an impurity introduced layer of about 2 μm in thickness.

All the sintered silicon carbide focus ring and the CVD silicon carbide focus ring have a number of void-like defects in the vicinities of the surfaces. Since, however, the aforementioned impurity introduction may be performed on any focus ring, it is possible to decrease the defect density in the vicinity of the surface of the focus ring, regardless of the method for the manufacture of the silicon carbide.

Figure 6:
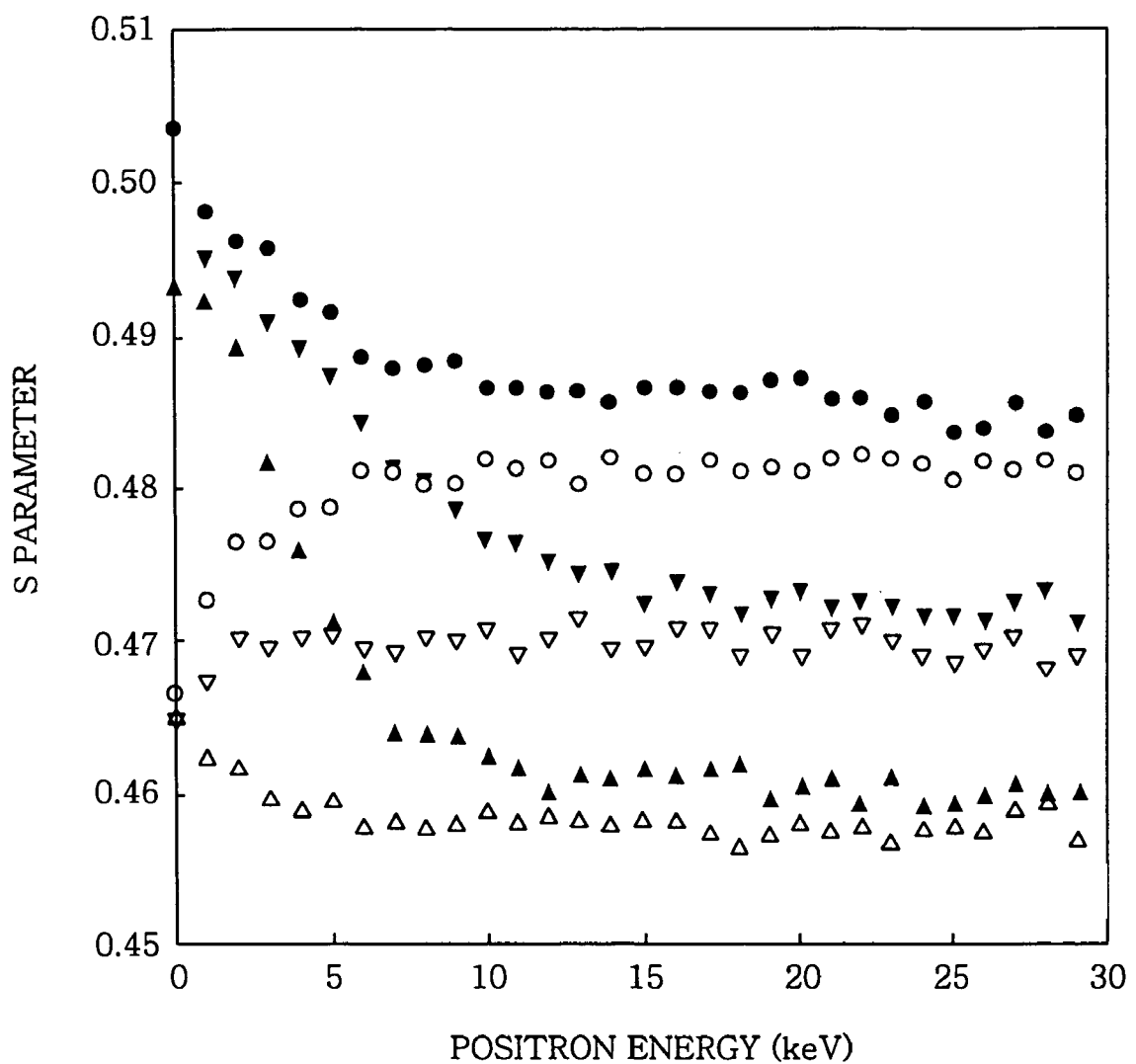
FIG. 6 is a graph for showing a relationship between a manufacturing method of silicon carbide and a defect density.

FIG. 6 is a graph for showing a relationship between a silicon carbide manufacturing method and a defect density.

In FIG. 6, the vertical axis indicates an S parameter corresponding to the defect density; and the horizontal axis is a positron energy corresponding to a depth from the surface of the focus ring. The graph shows measurement results obtained by a positron annihilation method on defect density in the vicinities of surfaces of focus rings made of various silicon carbides.

The positron annihilation method measures the defect density by implanting into the body of silicon carbide positrons emitted from sodium radioisotope and monitoring an energy generated by the pair annihilation of an implanted positron and an electron in silicon carbide, e.g., a bound electron and a free electron.

In the positron annihilation method, if the defect density is low, positrons penetrate into the lattice of atoms forming silicon carbide, and a pair annihilation ratio (hereinafter, referred to as an 'annihilation ratio') with the bound electrons of atoms increases. On the other hand, if the defect density is high, the positrons penetrate into the defects, and the annihilation ratio with the free electrons in the defects increases.

In general, a kinetic energy of the bound electron is greater than that of free electron, so that an energy produced by the pair annihilation of the positron and the bound electron is greater than that produced by the pair annihilation of the positron and the free electron. Accordingly, it is possible to measure the defect density by monitoring the pair annihilation energy. For example, if a measured pair annihilation energy is large, the defect density may be considered as small.

Further, the S parameter represents an annihilation ratio with the electrons having small kinetic energies, e.g., free electrons, thus, an annihilation ratio with the electrons having large kinetic energies, e.g., bound electrons, becomes large as the S parameter gets smaller. Therefore, in the graph of FIG. 6, the defect density is lower if the S parameter is smaller.

Further, the positron penetrates deeper into silicon carbide as the energy of the positron injected thereinto becomes increased. Thus, the graph shown in FIG. 6 indicates that if the positron energy of the horizontal axis becomes larger, a depth from the surface of silicon carbide gets deeper.

In the graph of FIG. 6, "●" indicates a sintered silicon carbide; "▲", a CVD silicon carbide of a low resistance; "▼", a CVD silicon carbide of a high resistance; "○", a sintered silicon carbide, to which impurities are introduced; "△", a CVD silicon carbide of a low resistance, to which impurities are introduced; and "∇", a CVD silicon carbide of a high resistance, to which impurities are introduced. Here, a resistance of the high resistance CVD silicon carbide is, e.g., 10000 Ωcm, and that of the low resistance CVD silicon carbide is, e.g., 0.01~0.1 Ωcm.

As for the sintered silicon carbide body, the low resistance CVD silicon carbide and the high resistance CVD silicon carbide on which the impurity introduction is not carried out, the S parameters are different from each other at the surfaces thereof where the positron energy is zero, as illustrated in the graph of FIG. 6. That is, the S parameter of the sintered silicon carbide is largest and that of the low resistance CVD silicon carbide is smallest. Therefore, in case where the impurity introduction is not carried out, the defect ratio of the sintered silicon carbide is largest and that of the low resistance CVD silicon carbide is smallest.

If the impurity introduction is performed, the S parameter of each silicon carbide reduces regardless of the manufacturing method thereof. For example, the S parameter of the sintered silicon carbide on which the impurity introduction is carried out becomes smaller than that of the low resistance CVD silicon carbide on which the impurity introduction is not carried out. Namely, even if the sintered silicon carbide is used in fabricating the focus ring, the impurity introduction performed thereon can decrease the defect density to be lower than that of the low resistance CVD silicon carbide on which the impurity introduction is not carried out.

Therefore, even in case where the sintered silicon carbide is used as the building material of the focus ring, the particle generation rate thereof at the initial etching processing stage can be smaller than that of the low resistance CVD silicon carbide on which the impurity introduction is not carried out if the impurity introduction is carried out on the sintered silicon carbide.

Further, all of the sintered silicon carbide body, the low resistance CVD silicon carbide and the high resistance CVD silicon carbide, subjected to the impurity introduction, have substantially identical S parameters at the surface thereof. Therefore, it is possible to decrease the defect density to a same low level by performing the impurity introduction, regardless of the manufacturing method of the silicon carbide.

Therefore, even in case where the sintered silicon carbide is used as the building material of the focus ring, by performing the impurity introduction thereon, the particle generation rate thereof at the initial etching processing stage may be decreased to the same low level as the CVD silicon carbide on which the impurity introduction is carried out.

Referring back to FIG. 3, the positrons are subsequently injected in the vicinity of the surface of the focus ring into which impurities are introduced, and the defect density in the vicinity of the surface of the focus ring is detected by the positron annihilation method (a detection step S33). If the detected defect density is decreased to be lower than a predetermined value, the focus ring is installed in the chamber; and, if the detected defect density is not decreased to be lower than the predetermined value, a corresponding focus ring is not installed in the chamber.

In accordance with the manufacturing method of the parts for the substrate processing apparatus in accordance with the first embodiment of the present invention, impurities are introduced to the void-like defects in the vicinity of the surface of the silicon carbide focus ring employed as a part for the substrate processing apparatus and, therefore, the defect density in the vicinity of the surface of the focus ring is decreased. Specifically, the defect density in the vicinity of the surface of the focus ring treated as described above becomes lower than that in the vicinity of the surface of a CVD silicon carbide body on which the impurity introduction is not carried out.

If the defect density in the vicinity of the surface is decreased, the particle generation rate at the initial etching processing stage is decreased. Therefore, it is possible to suppress the particle generation from the focus ring and prevent a decrease in an operating rate of the etching processing apparatus since an extended seasoning process is unnecessary. Further, the lapping for preventing particle scattering becomes unnecessary; and, even in case where the sintered silicon carbide which can be relatively easily manufactured is employed, the particle generation rate at the initial etching processing stage can be decreased, facilitating the manufacture of the focus ring.

Further, in the aforementioned present embodiment, since the focus ring is exposed to the plasma, which is produced from the processing gas formed of at least one of the carbon tetra fluoride gas and the oxygen gas during the etching process as well, the fluorine ions or the oxygen ions from the plasma are introduced to the defects as impurities. Therefore, the impurities can be easily introduced to the defects existing in the vicinity of the surface. Moreover, while the impurity introduced layer of the focus ring is consumed, the fluorine ions or the oxygen ions in the plasma are continuously introduced to the defects in the vicinity of a newly exposed surface to the plasma due to the consumption of the impurity introduced layer. That is, it is possible to continuously reduce the defect density in the vicinity of a newly exposed surface and to form a new impurity introduced layer thereat continuously.

Further, in the aforementioned embodiment, the positrons are injected to the vicinity of the surface of the focus ring where impurities are introduced to the void-like defects in the vicinity of the surface; and the defect density in the vicinity of the surface of the silicon carbide focus ring is detected by the positron annihilation method. By using the positron annihilation method, it is possible to easily detect the defect density in the vicinity of the surface of the silicon carbide focus ring. Thus, it is possible to readily estimate the amount of particle generation without conducting an actual product evaluation process for a long time; and hence, the focus ring can be easily manufactured.

In the following, parts for a substrate processing apparatus and a manufacturing method thereof in accordance with a second embodiment of the present invention will be explained.

The present embodiment basically has the same configuration and operation as those of the aforementioned first embodiment, excepting that a heat treatment is employed in lieu of the impurity introduction in the method for manufacturing the parts for the substrate processing apparatus. Therefore, redundant explanations of the same configuration and operation will be omitted, and only the different configuration and operation will be discussed hereinafter.

In a focus ring employed as a part for a substrate processing apparatus in accordance with the present embodiment, a defect density in the vicinity of a surface thereof is also set to be lower than that in the vicinity of the surface on a CVD silicon carbide body, as in the aforementioned focus ring 16. The focus ring in accordance with the present embodiment is different from the focus ring 16 in that it is manufactured by the manufacturing method in accordance with the present embodiment that will now be explained.

Hereinafter, the method for the manufacture of parts for a substrate processing apparatus in accordance with the present embodiment will be explained. The present method is also based on the hypothesis of the particle generation mechanism at the aforementioned initial etching processing stage; and the defect density in the vicinity of the surface of the silicon carbide focus ring employed as the part for the substrate processing apparatus is decreased, as in the method in accordance with the first embodiment.

Figure 7:
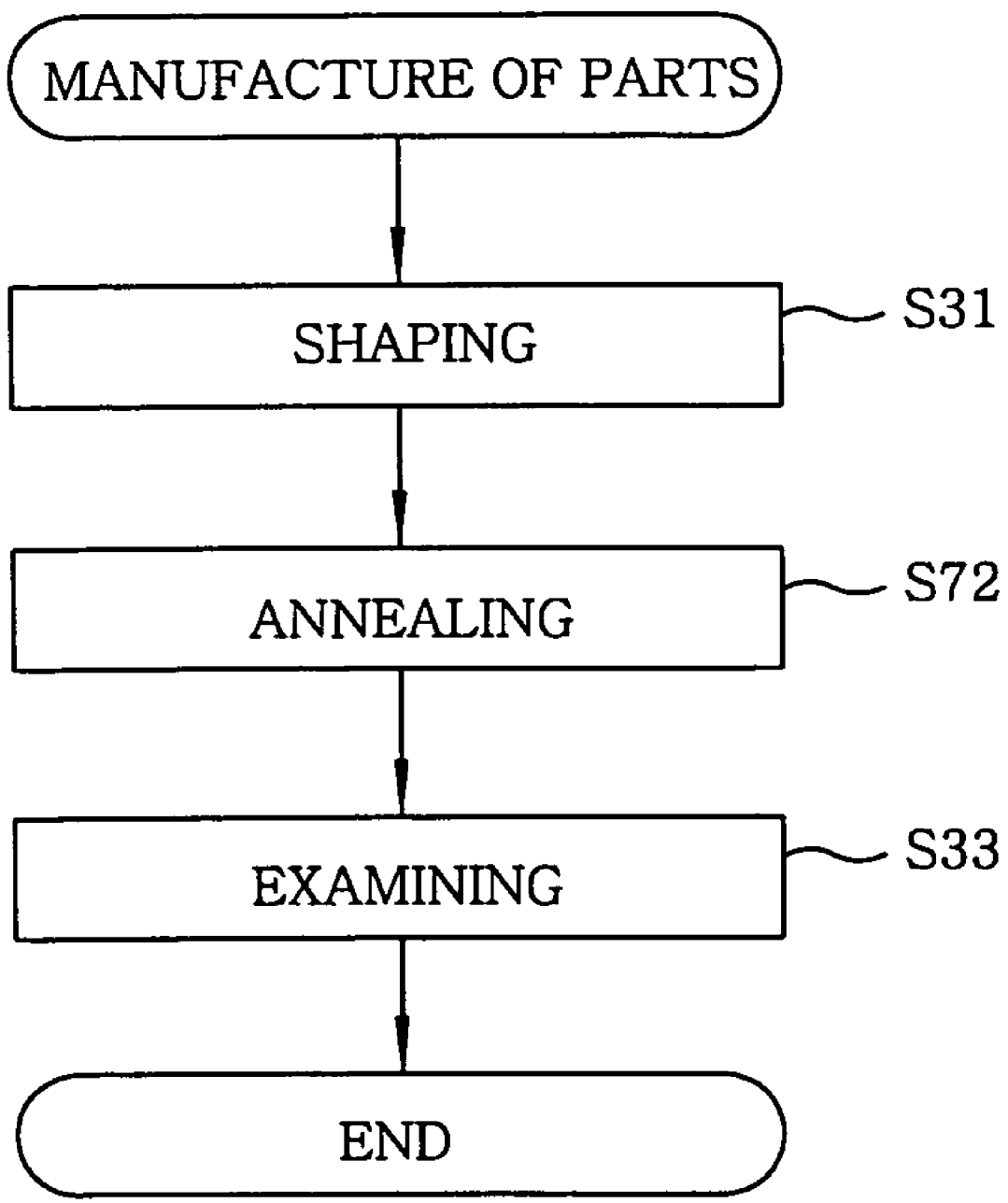
FIG. 7 explains a flowchart of a part manufacturing process as a manufacturing method of a part for a substrate processing apparatus in accordance with a second embodiment of the present invention.

Referring to FIG. 7, there is illustrated a flowchart of the method for manufacturing the parts for the substrate processing apparatus in accordance with the second embodiment of the present invention. Further, steps S31 and S33 in the process shown in FIG. 7 are identical to those shown in FIG. 3.

In FIG. 7, the shaped focus ring is heated to 1200° C. to perform a heat treatment (an annealing) thereon in a nonreactive gas atmosphere after step S31 (a defect density lowering step) (step S72).

Specifically, in step S72, the focus ring is disposed in an argon gas atmosphere, and maintained at 1200° C. for 20 minutes or longer. As a result, the void-like defects in the vicinity of the surface of the focus ring are filled with a molten silicon carbide molecule or the like, and thus, being removed therefrom. Hence, the defect density in the vicinity of the surface of the focus ring is decreased.

Figure 8:
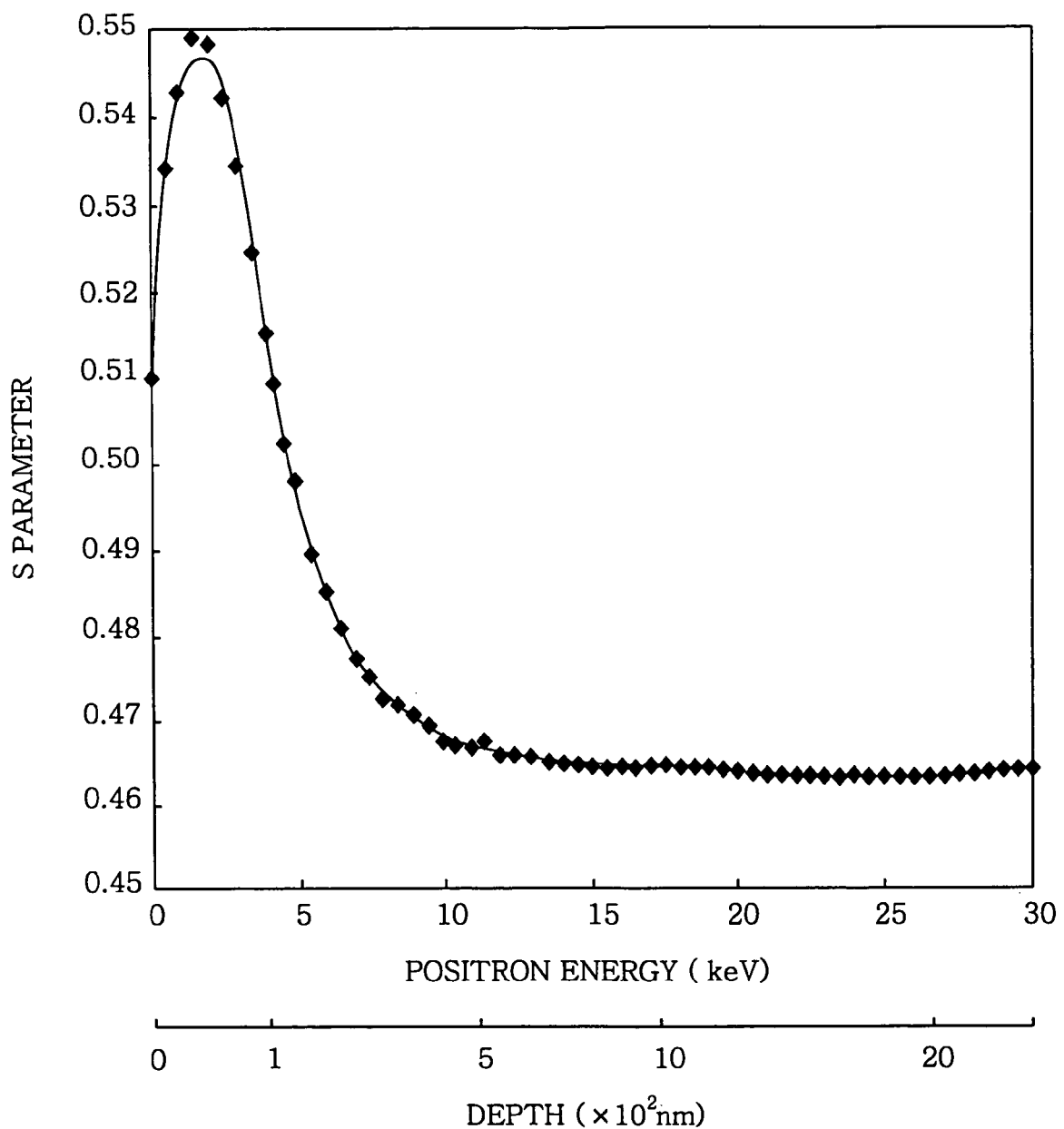
FIG. 8 is a graph for showing a result on a heat treatment process in step S72 of FIG. 7.

FIG. 8 is a graph for showing a heat treatment result of step S72 in FIG. 7.

In FIG. 8, the vertical axis is an S parameter corresponding to the defect density; and the horizontal axis is a positron energy corresponding to the depth from the surface of the focus ring.

This graph shows a measurement result of the defect density obtained by the positron annihilation method, in case where the focus ring is heat treated at 1400° C. As illustrated in the graph, the S parameter is rapidly decreased within the range from the surface to 200 nm (0.2 μm) in depth. Namely, the defect density in the vicinity of the surface of the focus ring is decreased. Such a phenomenon consistently takes place in both of the sintered silicon carbide and the CVD silicon carbide.

Further, if the temperature of the focus ring is 1400° C. or higher, the silicon carbide begins to be evaporated; and, if the temperature thereof is 1600° C. or higher, the evaporation becomes severe. Therefore, the temperature of the focus ring is preferably set in the range of 1200° C.~1600° C., and more preferably, 1200° C.~1400° C., during the heat treatment process in step S72.

In accordance with the manufacturing method of the parts for the substrate processing apparatus in accordance with the second embodiment of the present invention, the heat treatment is carried out on the silicon carbide focus ring employed as the part for the substrate processing apparatus, so that the void-like defects in the vicinity of the surface are removed, and thus, reducing the defect density in the vicinity of the surface of the focus ring.

If the defect density in the vicinity of the surface of the focus ring is decreased, the particle generation rate is decreased at the initial etching processing stage. Therefore, it is possible to suppress the particle generation from the focus ring and prevent a decrease in an operating ratio of the etching processing apparatus since an extended seasoning process is unnecessary. Further, the lapping for preventing particle scattering becomes unnecessary, thereby, facilitating the manufacture of the focus ring.

Further, in the annealing process in step S72, the temperature of the focus ring is set in the range of 1200° C.~1600° C., so that the heat treatment is accelerated, and at the same time, the evaporation of the silicon carbide focus ring is suppressed.

In the aforementioned embodiments, only a case where the present invention is applied to a focus ring employed as a part for a substrate processing apparatus has been explained, but the present invention is applicable to any parts for the substrate processing apparatus without being limited to the focus ring. For example, the present invention may be applied to any parts for the substrate processing apparatus, such as an upper electrode, an exhaust adjusting ring, a shield ring and the like, used in the wear environment.

Further, the manufacturing method of the present invention is applicable not only to the parts for the substrate processing apparatus, but also to parts constituting a transfer device, e.g., a load-lock chamber, which are used in the wear environment like the parts for the substrate processing apparatus.

In the aforementioned embodiments, a substrate to be processed is a semiconductor wafer, but it is not limited thereto. For example, a glass substrate for, e.g., an LCD (Liquid Crystal Display) or an FPD (Flat Panel Display) may be employed as the substrate to be processed.

EFFECT OF THE PRESENT INVENTION

In accordance with a method for manufacturing a part for a substrate processing apparatus, as defined in claim 1, a void-like defect density in the vicinity of a surface of the part for the substrate processing apparatus is lowered. If the void-like defect density is lowered, the particle generation rate thereof at the initial etching processing stage is decreased. Therefore, it is possible to suppress the particle generation from the part for the substrate processing apparatus and prevent a decrease in an operating rate of the substrate processing apparatus since an extended seasoning process is unnecessary. Further, the lapping for preventing particle scattering becomes unnecessary; and, even in case where the sintered silicon carbide which can be relatively easily manufactured is employed, the particle generation rate at the initial etching processing stage can be decreased, facilitating the manufacture of the focus ring.

In accordance with the method as defined in claim 2, impurities are introduced to the void-like defects existing in the vicinity of the surface of the part for the substrate processing apparatus, so that the defect density can be securely lowered.

In accordance with the method as defined in claim 3, since the impurities are produced from a plasma generated from at least one of a fluorine containing gas, a carbon containing gas and an oxygen containing gas, introduction into the defects existing in the vicinity of the surface may be readily carried out. Further, since the plasma is generated during the etching processing, introduction of impurities generated therefrom is continuously performed during the etching processing. Thus, it is possible to continuously reduce the defect density.

In accordance with the method as defined in claim 4, the part for the substrate processing apparatus is heat treated, so that the void-like defects existing in the vicinity of the surface can be consumed, to thereby, securely lower the defect density.

In accordance with the method as defined in claim 5, since the temperature of the part for the substrate processing apparatus is set in the range of 1200° C.~1600° C. in a nonreactive gas atmosphere, it is possible to accelerate the heat treatment and prevent the evaporation of materials constituting the parts for the substrate processing apparatus.

In accordance with the method as defined in claim 6, the vicinity of the surface of the part for the substrate processing apparatus is examined by a positron annihilation method. The positron annihilation method can readily detect the void-like defect density existing in the vicinity of the surface of the part for the processing apparatus. Therefore, it is possible to readily estimate the amount of particle generation from the part for the substrate processing apparatus; and hence, the part for the substrate processing apparatus can be easily manufactured.

In accordance with a part for a substrate processing apparatus, as defined in claim 7, a void-like defect density in the vicinity of a surface is smaller than that in the vicinity of a surface of a silicon carbide body formed by a chemical vapor deposition (CVD) method. If the void-like defect density is smaller than that formed by the CVD method, the particle generation rate at the initial etching processing stage is decreased. Thus, it is possible to suppress the particle generation from the part for the substrate processing apparatus and prevent a decrease in an operating rate of the substrate processing apparatus since an extended seasoning process is unnecessary. Further, the lapping for preventing particle scattering becomes unnecessary; and, even in case where the sintered silicon carbide which can be relatively easily manufactured is employed, the particle generation rate at the initial etching processing stage can be decreased, facilitating the manufacture of the focus ring.

While the invention has been shown and described with respect to the preferred embodiments, it will be understood by those skilled in the art that various changes and modifications may be made without departing from the scope of the invention as defined in the following claims.

What is claimed is:

1. A method for manufacturing a part for a substrate processing apparatus, which is installed in a chamber of the substrate processing apparatus for accommodating therein a substrate, the method comprising the step of lowering a void defect density in the vicinity of a surface of the part for the substrate processing apparatus, the part having a plurality of void defects in the vicinity of the surface of the part before the step of lowering is performed, wherein, in the defect density lowering step, impurities are introduced into the defects by a plasma ion implantation process, and wherein the impurities are produced from a plasma generated from at least one of a fluorine containing gas, a carbon containing gas and an oxygen containing gas.

2. The method of claim 1, further comprising the step of examining the vicinity of a surface of the part for the substrate processing apparatus by a positron annihilation method.

3. A method for manufacturing a part for a substrate processing apparatus, which is installed in a chamber of the substrate processing apparatus for accommodating therein a substrate, the method comprising the step of lowering a void defect density in the vicinity of a surface of the part for the substrate processing apparatus, wherein the void defect density in the vicinity of the surface of the part is smaller than that in the vicinity of a surface of a silicon carbide body formed by a chemical vapor deposition method, wherein the part has a plurality of void defects in the vicinity of the surface of the part before the step of lowering is performed, wherein, in the defect density lowering step, impurities are introduced into the defects by a plasma ion implantation process, and wherein the impurities are produced from a plasma generated from at least one of a fluorine containing gas, a carbon containing gas and an oxygen containing gas.

4. The method of claim 1, wherein the vicinity of the part is made of silicon carbide and the void defects result from deficiency of carbon or silicon.

* * * * *